United States Patent [19]
Ikeda

[11] Patent Number: 5,703,822
[45] Date of Patent: Dec. 30, 1997

[54] SERIAL ACCESS MEMORY DEVICE INCLUDING MEMORY SECTIONS HAVING DIFFERENT LATENCIES

[75] Inventor: Hiroaki Ikeda, Tokyo, Japan

[73] Assignee: NEC Corporation, Tokyo, Japan

[21] Appl. No.: 788,077

[22] Filed: Jan. 22, 1997

[30] Foreign Application Priority Data

Jan. 23, 1996 [JP] Japan .................. 8-009120

[51] Int. Cl.$^6$ .................................................. G11C 7/00
[52] U.S. Cl. .................. 365/221; 365/233; 365/230.09; 365/239
[58] Field of Search .................. 365/221, 233, 365/220, 230.09, 239

[56] References Cited

U.S. PATENT DOCUMENTS 5,027,326  6/1991  Jones .................................... 365/221
5,568,445  10/1996  Park et al. ............................ 365/233

FOREIGN PATENT DOCUMENTS 62-232797  10/1987  Japan .

*Primary Examiner*—David C. Nelms
*Assistant Examiner*—Huan Hoang
*Attorney, Agent, or Firm*—Sughrue, Mion, Zinn, Macpeak & Seas, PLLC

[57] ABSTRACT

In a serial access memory device, a first memory section divided into a plurality of first segments and a second memory section divided into a plurality of second segments are provided. A first latency of the first memory section is shorter than a second latency of the second memory section. The serial accesses of segments of the first and second memory sections are simultaneously initiated. The serial access of segments of the first memory section is completed within a time period corresponding to the second latency.

7 Claims, 12 Drawing Sheets

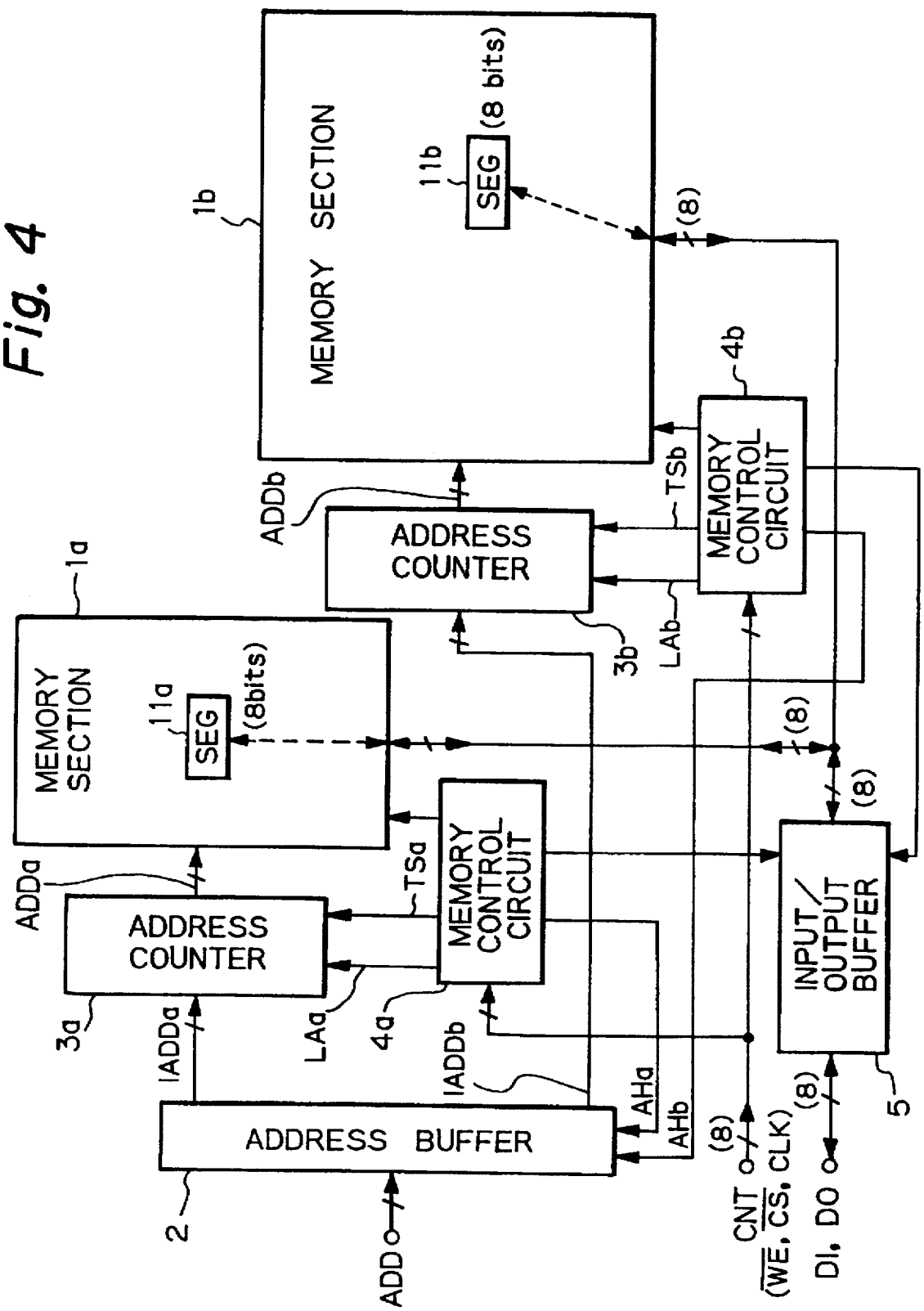

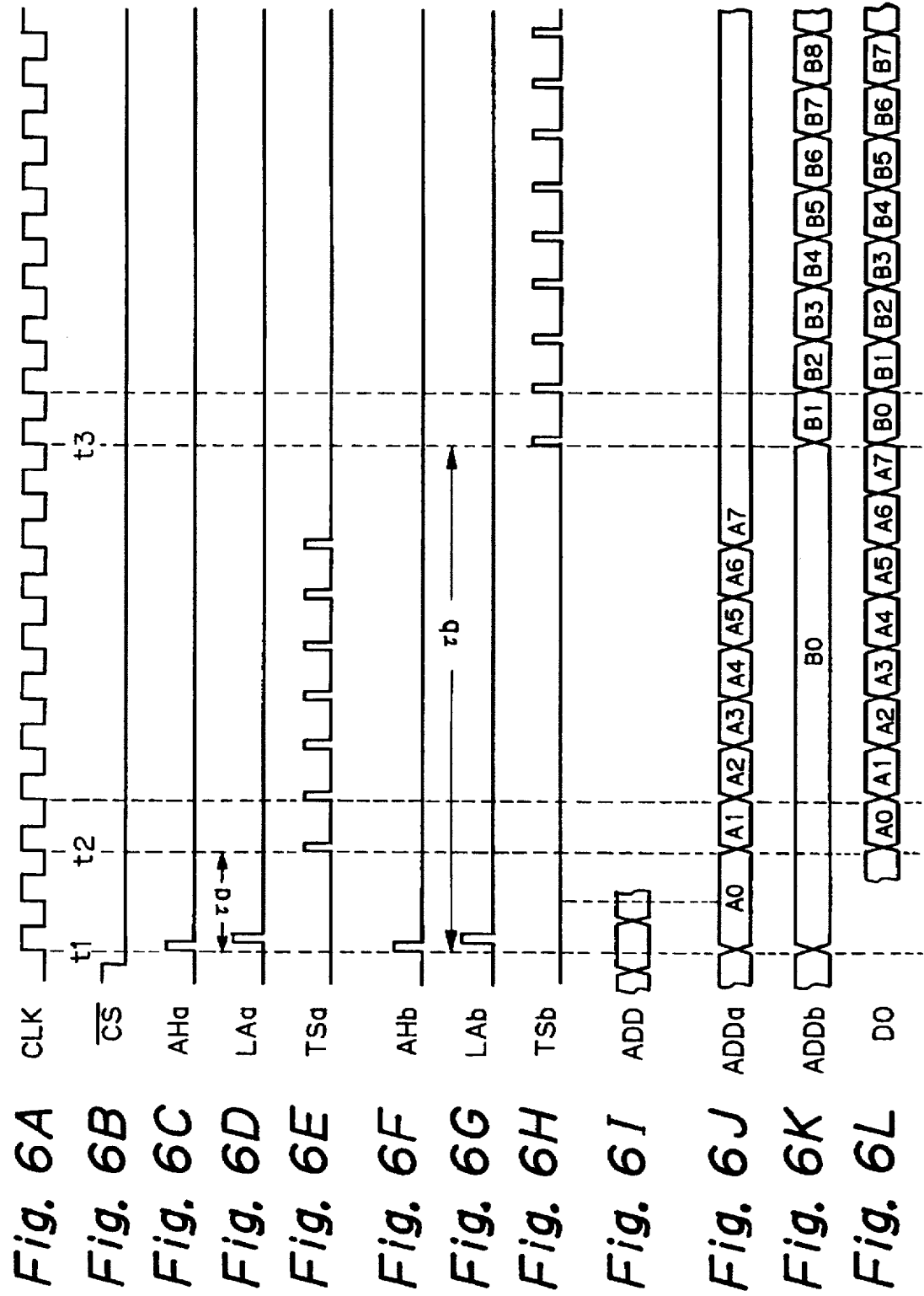

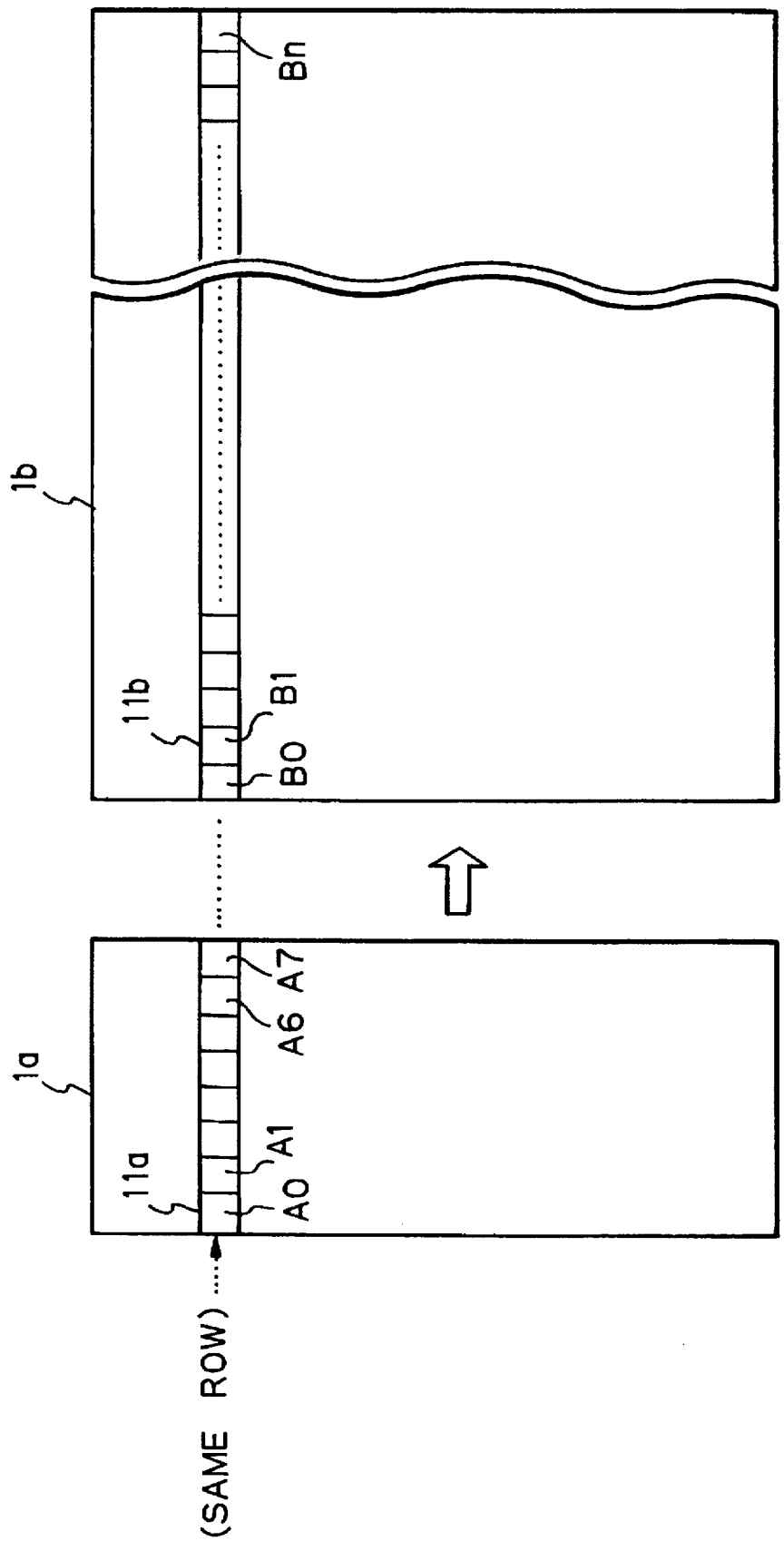

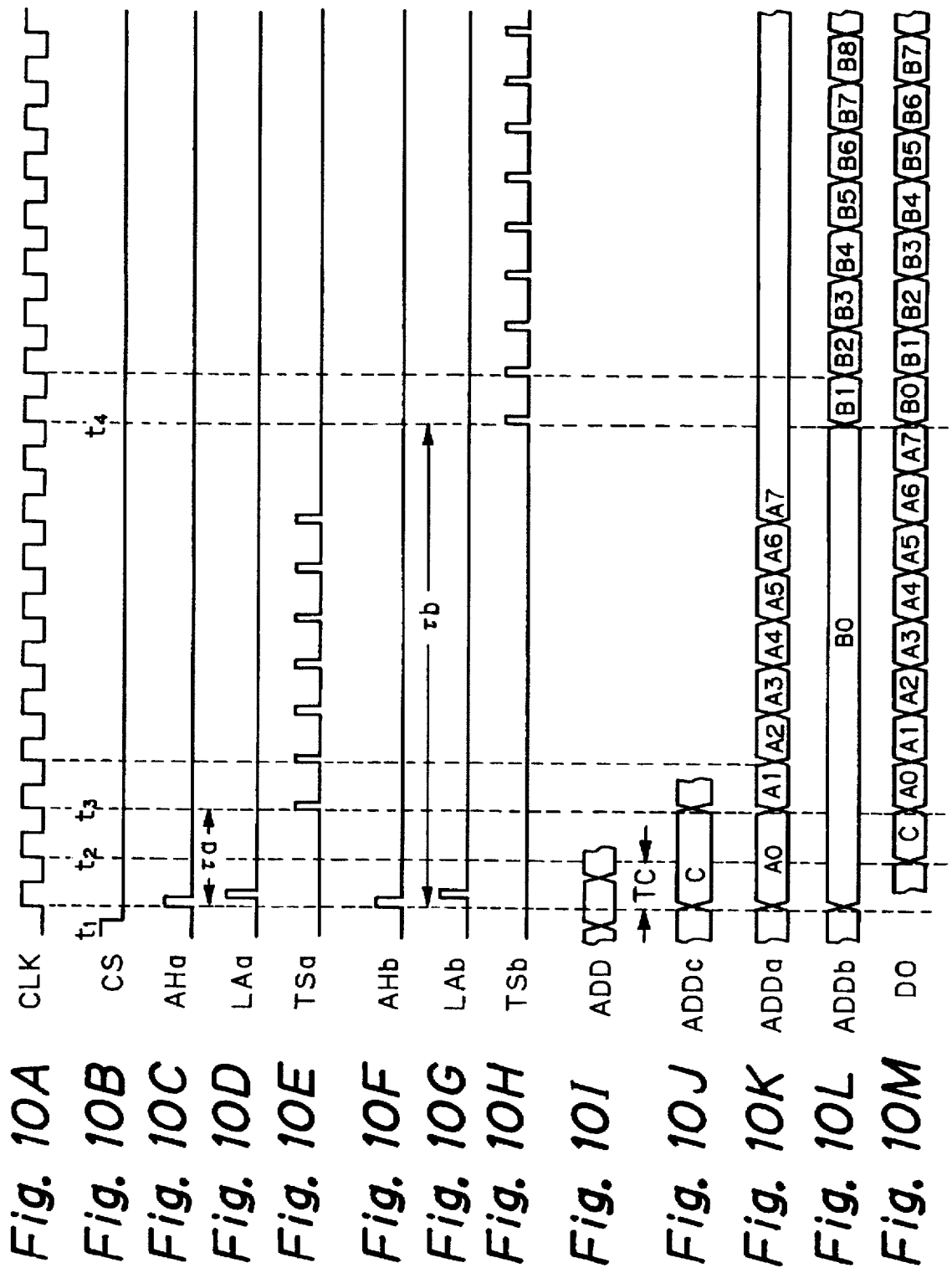

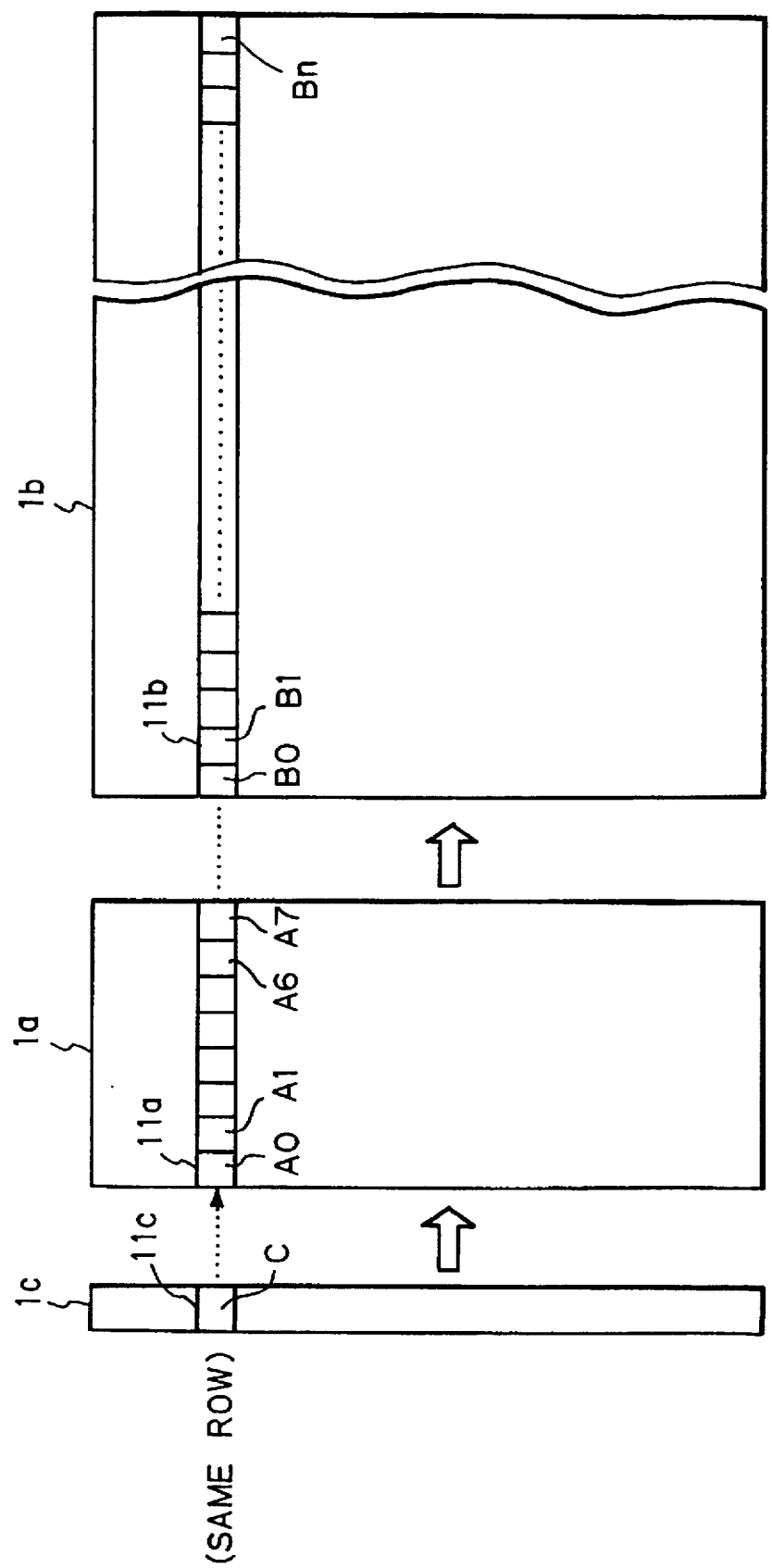

SERIAL ACCESS MEMORY DEVICE INCLUDING MEMORY SECTIONS HAVING DIFFERENT LATENCIES

BACKGROUND OF THE INVENTION

1. Field of the Invention

The present invention relates to a serial access memory device used in an image processing system or the like.

2. Description of the Related Art

In a first prior art serial access memory device, a memory section includes row and column decoders, sense amplifiers, column selection circuits and the like. Memory cells of the memory section are divided into a plurality of segments each, formed by 64 memory cells, for example. One of the segments is accessed by an address buffer.

In a write mode, 64-bit data are simultaneously written from a data register into the designated segment. On the other hand, in a read mode, 64-bit data are simultaneously read out of the designated segment to the data register. Note that the memory section and the data register are interconnected by a 64-bit data bus.

Also, the data register has an input/output terminal having a smaller bit width such as 8 bits.

In the first prior art serial memory device, in a write mode, the data register is operated to carry out a serial-to-parallel transformation. That is, eight 8-bit input data signals are transformed into a 64-bit signal on the data bus. On the other hand, in a read mode, the data register is operated to carry out a parallel-to-serial transformation. That is, a 64-bit signal on the data bus is transformed into eight 8-bit output data signals.

The first prior art serial access memory device will be explained later in detail.

In the above-described first prior art serial access memory device, however, the data rate is low due to the latency of the memory section.

In order to enhance the data rate, one approach is to adopt a high speed static random access memory (SRAM) as the memory section which reduces the latency; however, the SRAM is expensive to increase the manufacturing cost, and the chip size is increased which reduces the manufacturing yield. Also, another approach is to increase the bit width of the data bus and the data register to reduce the ratio of the latency to the serial access time; however, in this case, the data bus and the data register are increased in size.

In a second prior art serial access memory device (see: JP-A-62-232797), a plurality of high speed SRAM banks and a plurality of low speed dynamic random access memory (DRAM) banks are provided. The outputs of the SRAM banks and the DRAM banks are selectively connected via a selector to an output register which is also connected to an output terminal.

In the second prior art serial access memory, the SRAM banks and the DRAM banks are simultaneously accessed. Therefore, even if the latency of the DRAM banks is relatively long, since the read data of the SRAM banks are transmitted to the output register for the latency of the DRAM banks, the data rate can be substantially increased.

The second prior art serial access memory also will be explained later in detail.

In the second prior art serial access device, however, since all the SRAM banks and the DRAM banks are simultaneously accessed, if the serial access length is large, the number of banks as well as the peripheral circuits thereof needs to be large, which increases the device in size.

SUMMARY OF THE INVENTION

It is an object of the present invention to increase the data rate of a serial access memory device without increasing the device in size and in manufacturing cost.

According to the present invention, in a serial access memory device, a first memory section divided into a plurality of first segments and a second memory section divided into a plurality of second segments are provided. A first latency of the first memory section is shorter than a second latency of the second memory section. The serial accesses of segments of the first and second memory sections are simultaneously initiated. The serial access of segments of the first memory section is completed within a time period corresponding to the second latency.

Also, a third memory section divided into a plurality of third segments is provided. A third latency of the third memory section is shorter than the first latency of the first memory section. The serial accesses of segments of the third memory section are also initiated simultaneously with the first and second memory sections. The serial access of segments of the third memory section is completed within a time period corresponding to the first latency.

BRIEF DESCRIPTION OF THE DRAWINGS

The present invention will be more clearly understood from the description as set forth below, as compared with the prior art, with reference to the accompanying drawings, wherein:

FIG. 4 is a circuit diagram illustrating a first embodiment of the serial access memory device according to the present invention;

FIGS. 6A through 6L are timing diagrams showing the operation of the device of FIGS. 4, 5A and 5B;

FIG. 7 is a detailed diagram of the memory sections of FIG. 4;

FIGS. 10A through 10M are timing diagrams showing the operation of the device of FIGS. 8 and 9; and FIG. 11 is a detailed diagram of the memory section of FIG. 8.

DESCRIPTION OF THE PREFERRED EMBODIMENTS

Before the description of the preferred embodiments, prior art serial access memory devices will be explained with reference to FIGS. 1, 2A through 2D and 3.

Figure 1:
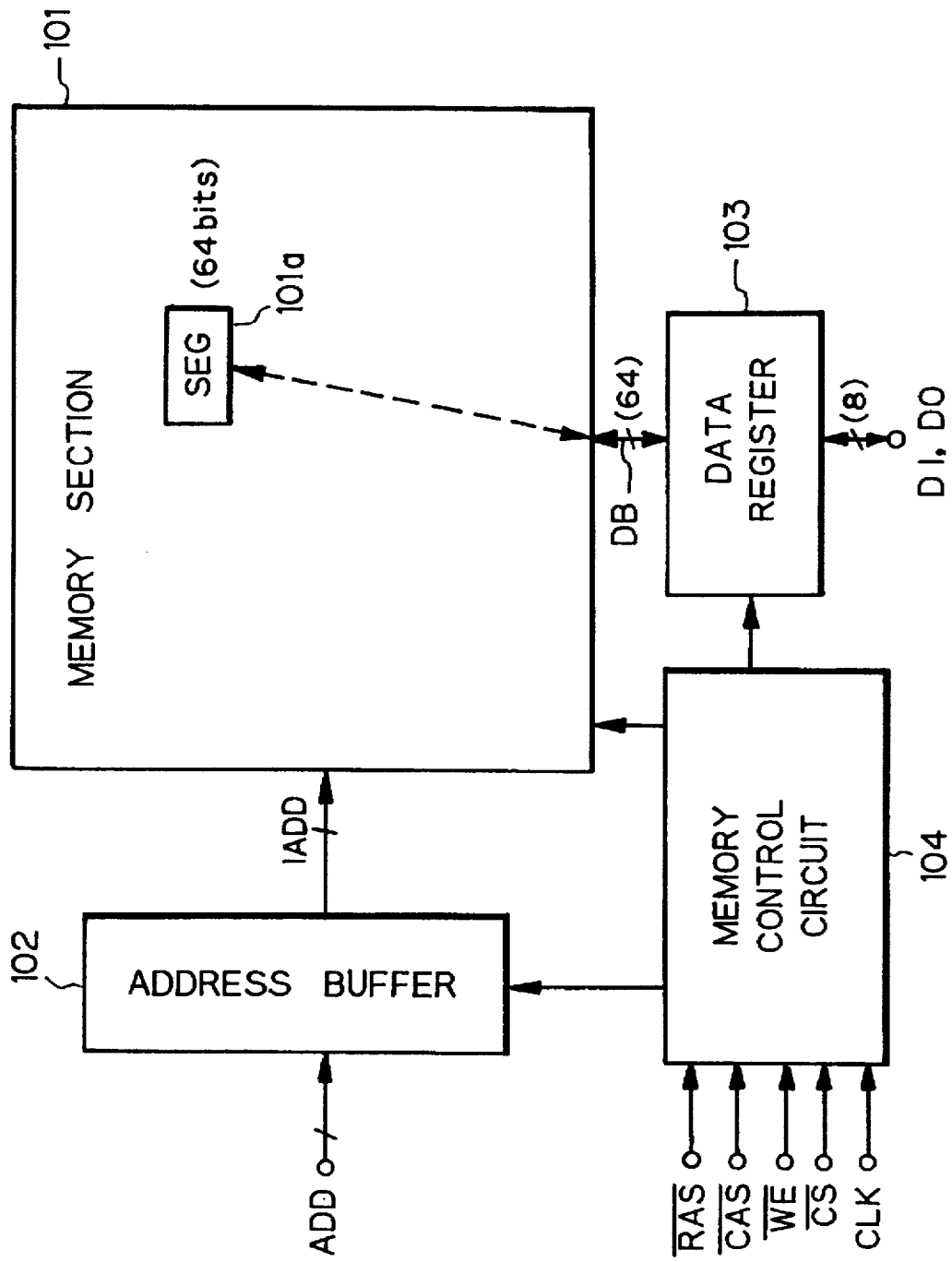
FIG. 1 is a block circuit deagram illustrating a first prior art serial access memory device.

In FIG. 1, which illustrates a first prior art serial access memory device, reference numeral 101 designates a memory section including row and column decoders, sense amplifiers, column selection circuits and the like. Memory cells of the memory section 101 are divided into a plurality of segments 101a, each of which has 64 memory cells, for example. One of the segments 101a is accessed by an address buffer 102. That is, the address buffer 102 receives an external address signal ADD to generate an internal address signal IADD for designating one of the segments 101a.

In a write mode, 64-bit data are simultaneously written from a data register 103 into the designated segment 101a. On the other hand, in a read mode, 64-bit data are simultaneously read out of the designated segment 101a to the data register 103. Note that the memory section 101 and the data register 103 are interconnected by a 64-bit data bus DB.

The data register 103 has an 8-bit input/output terminal for receiving an 8-bit input data signal DI and generating an 8-bit output data signal DO.

The memory section 101, the address buffer 102 and the data register 103 are controlled by a memory control circuit 104 which receives control signals such as an inverted signal of a row address strobe signal RAS, an inverted signal of a column address strobe signal CAS, an inverted signal of a write enable signal WE, an inverted signal of a chip selection signal CS and a clock signal CLK.

In FIG. 1, in a write mode, the data register 103 is operated by the memory control circuit 104 to carry out a serial-to-parallel transformation. That is, eight 8-bit input data signals DI are transformed into a 64-bit signal on the data bus DB. On the other hand, in a read mode, the data register 103 is operated by the memory control circuit 104 to carry out a parallel-to-serial transformation. That is, a 64-bit signal on the data bus DB is transformed into eight 8-bit output data signals DO.

The read operation of the device of FIG. 1 is explained next with reference to FIGS. 2A through 2D.

Figure 2:
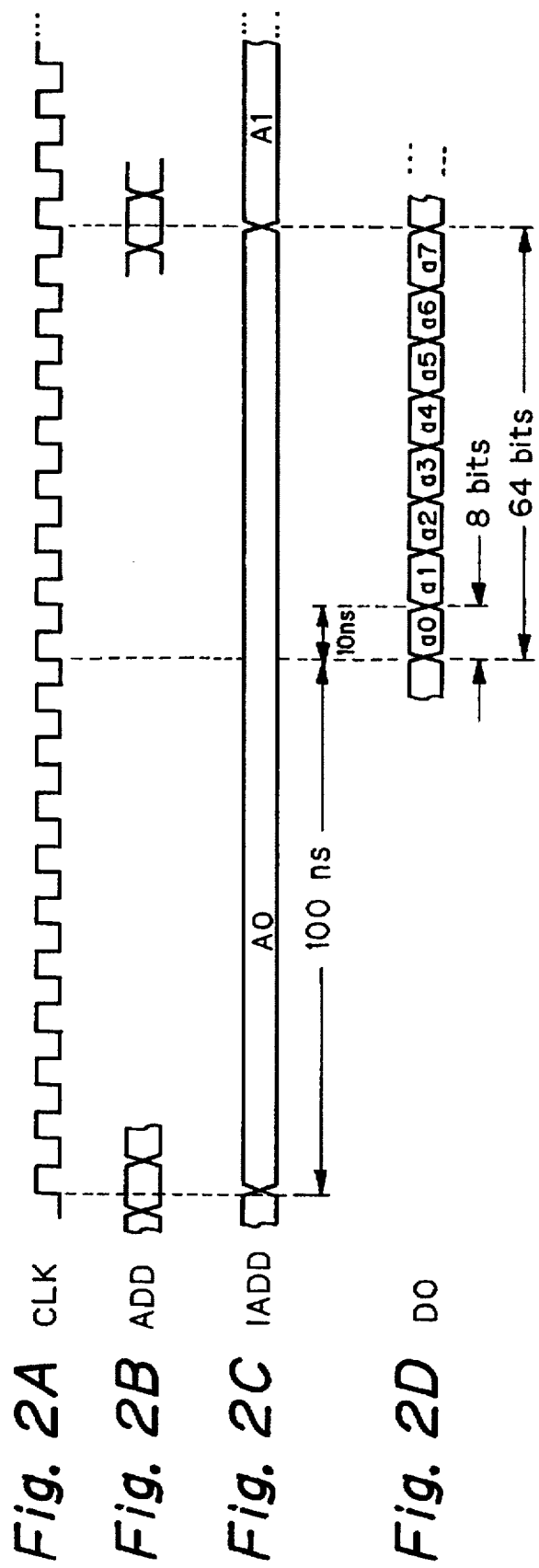
FIGS. 2A through 2D are timing diagrams showing the operation of the device of FIG. 1.

First, an external address signal ADD as shown in FIG. 2B is latched in the address buffer 102 in synchronization with the clock signal CLK as shown in FIG. 2A. In this case, the address buffer 102 generates an internal address signal A0. Then, the internal address signal A0 is held in the address buffer 102 for at least a latency from a timing when an access is initiated for the memory section 101 to a timing when a data writing or reading operation upon the memory section 101 is completed. For example, the latency is ten cycles, i.e.

10 ns×10=100 ns

After the latency has passed, as shown in FIG. 2D, the data register 102 serially generates eight 8-bit output data signals a0, a1, . . . , a7 as the data output signal DO. For example if a time required for outputting each of the signals a0, a1, . . . , a7 is one cycle (10 ns), a time required for a serial access length 8 (=64 bits) is 100+10×8=180 ns  (1)

Therefore, in this case, a data rate per one byte is 180 ns/8=22.5 ns

Note that, even if the serial access length is 1024 (=8192 bits), the data rate is (100+10×8)×128/1024=22.5 ns.  (1)

In the device of FIG. 1, in order to enhance the data rate, one approach is to adopt a high speed SRAM as the memory section 101 to reduce the latency; however, the SRAM is expensive which increases the manufacturing cost, and the chip size is increased which reduces the manufacturing yield. Also, another approach is to increase the bit width of the data bus DB and the data register 103 to reduce the ratio of the latency to the serial access time; however, the data bus DB and the data register 103 are increased in size.

Figure 3:
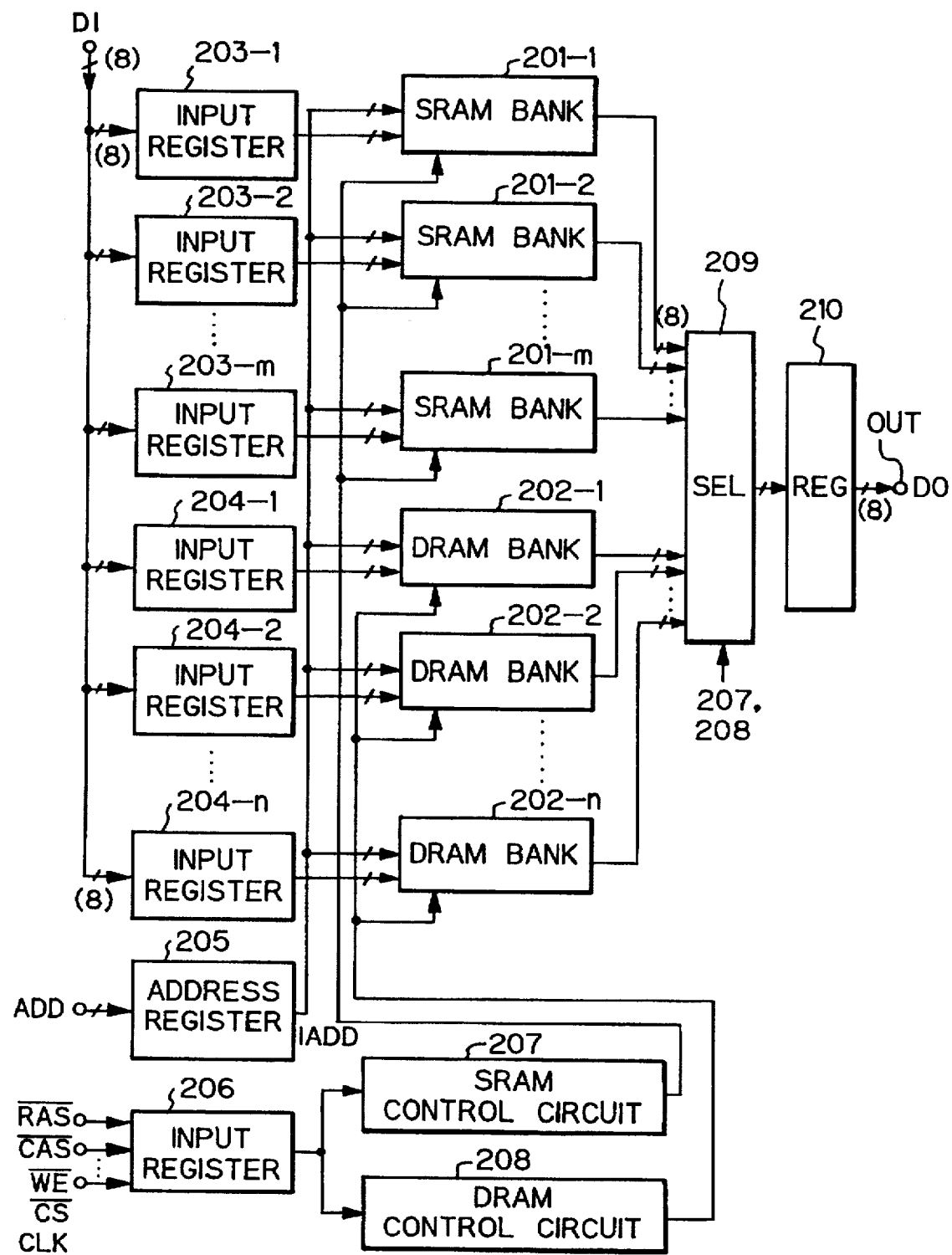
FIG. 3 is a block circuit diagram illustrating a second prior art serial access memory device.

In FIG. 3, which illustrates a second prior art serial access memory device (see: JP-A-62-232797), a plurality of high speed SRAM banks 201-1, 201-2, . . . , 201-m and a plurality of low speed DRAM banks 201-1, 202-2, . . . , 202-n are provided. The SRAM banks 201-1, 201-2, . . . , 201-m are connected to input registers 203-1, 203-2, . . . , 203-m, respectively, for receiving an 8-bit input data signal DI. Also, the DRAM banks 202-1, 202-2, . . . , 202-n are connected to input registers 204-1, 204-2, . . . , 204-n, respectively, for receiving the 8-bit input data signal DI.

In addition, an address register 205 is provided to receive an external address signal ADD and supply an internal address signal IADD to the SRAM banks 201-1, 201-2, . . . , 201-m and the DRAM bank 202-1, 202-2, . . . , 202-n.

Further, an input register 206 is provided to receive control signals such as an inverted signal of a row address strobe signal RAS, an inverted signal of a column address strobe signal CAS, an inverted signal of a write enable signal WE, an inverted signal of a chip selection signal CE and a clock signal CLK. The control signals are supplied to an SRAM control circuit 207 for controlling the SRAM banks 201-1, 201-2, . . . , 201-m and a DRAM control circuit 208 for controlling the DRAM banks 202-1, 202-2, . . . , 202-n.

The outputs of the SRAM banks 201-1, 201-2, . . . , 201-m and the DRAM banks 202-1, 202-2, . . . , 202-n are selectively connected via a selector 209 to an output register 210 which is also connected to an output terminal OUT for outputting an B-bit output data signal DO.

In FIG. 3, the SRAM banks 201-1, 201-2, . . . , 201-m and the DRAM banks 202-1, 202-2, . . . , 202-n are simultaneously accessed. For example, in a read mode, first, read data of the SRAM banks 201-1, 201-2, . . . , 201-m are sequentially transmitted via the selector 209 to the output register 210. Thereafter, read data of the DRAM banks 202-1, 202-2, . . . , 202-n are sequentially transmitted via the selector 209 to the output register 210.

Therefore, even if the latency of the DRAM banks 202-1, 202-2, . . . , 202-n is relatively long, since the read data of the SRAM banks 201-1, 201-2, . . . , 201-m are transmitted to the output register 210 for the latency of the DRAM banks 202-1, 202-2, . . . , 202-n, the data rate can be substantially increased.

In the device of FIG. 3, however, since all the SRAM banks 201-1, 201-2, . . . , 201-m and the DRAM banks 202-1, 202-2, . . . , 202-n are simultaneously accessed, if the serial access length is large, the number of banks as well as the peripheral circuits thereof needs to be large, which increases the device in size.

In FIG. 4, which illustrates a first embodiment of the present invention, a memory section 1a having a relatively short latency and a memory section 1b having a relatively long latency are provided. Memory cells of the memory section 1a are divided into a plurality of segments 11a which have a predetermined number of memory cells, for example, 8 memory cells. Similarly, memory cells of the memory section 1b are divided into a plurality of segments which has a predetermined number of memory cells, for example, 8 memory cells.

An address buffer 2 receives an external address signal ADD and generates internal address signals IADDa and IADDb for the memory sections 1a and 1b, respectively. In this case, the address buffer 2 holds the internal address IADDa for the latency of the memory section 1a, and holds the internal address IADDb for the latency of the memory section 1b. Also, the internal address signal IADDa is supplied as an initial value to an address counter 3a, and the internal address signal IADDb is supplied as an initial value to an address counter 3b.

One of the segments 11a in the memory section 1a is accessed by an address signal ADDa of the address counter 3a, and one of the segments 11b in the memory section 1b is accessed by an address signal ADDb of the address counter 3b.

The address signal ADDa of the address counter 3a is latched and incremented by a latch signal LAa and a timing signal TSa generated from a memory control circuit 4a, and the address signal ADDb of the address counter 3b is latched and incremented by a latch signal LAb and a timing signal TSb generated from a memory control circuit 4b.

The memory sections 1a and 1b are connected to an input/output buffer 5 which is also connected to an input/output terminal for receiving an 8-bit input data signal DI and generating an 8-bit output data signal DO.

The memory section 1a, the address buffer 2, the address counter 3a and the input/output buffer 5 are controlled by the memory control circuit 4a. Also, the memory section 1b, the address buffer 2, the address counter 3b and the input/output buffer 5 are controlled by the memory control circuit 4b. Note that the memory control circuits 4a and 4b receive control signals CNT such as an inverted signal of a write enable signal WE, an inverted signal of a chip selection signal CS and a clock signal CLK.

Figure 5A:
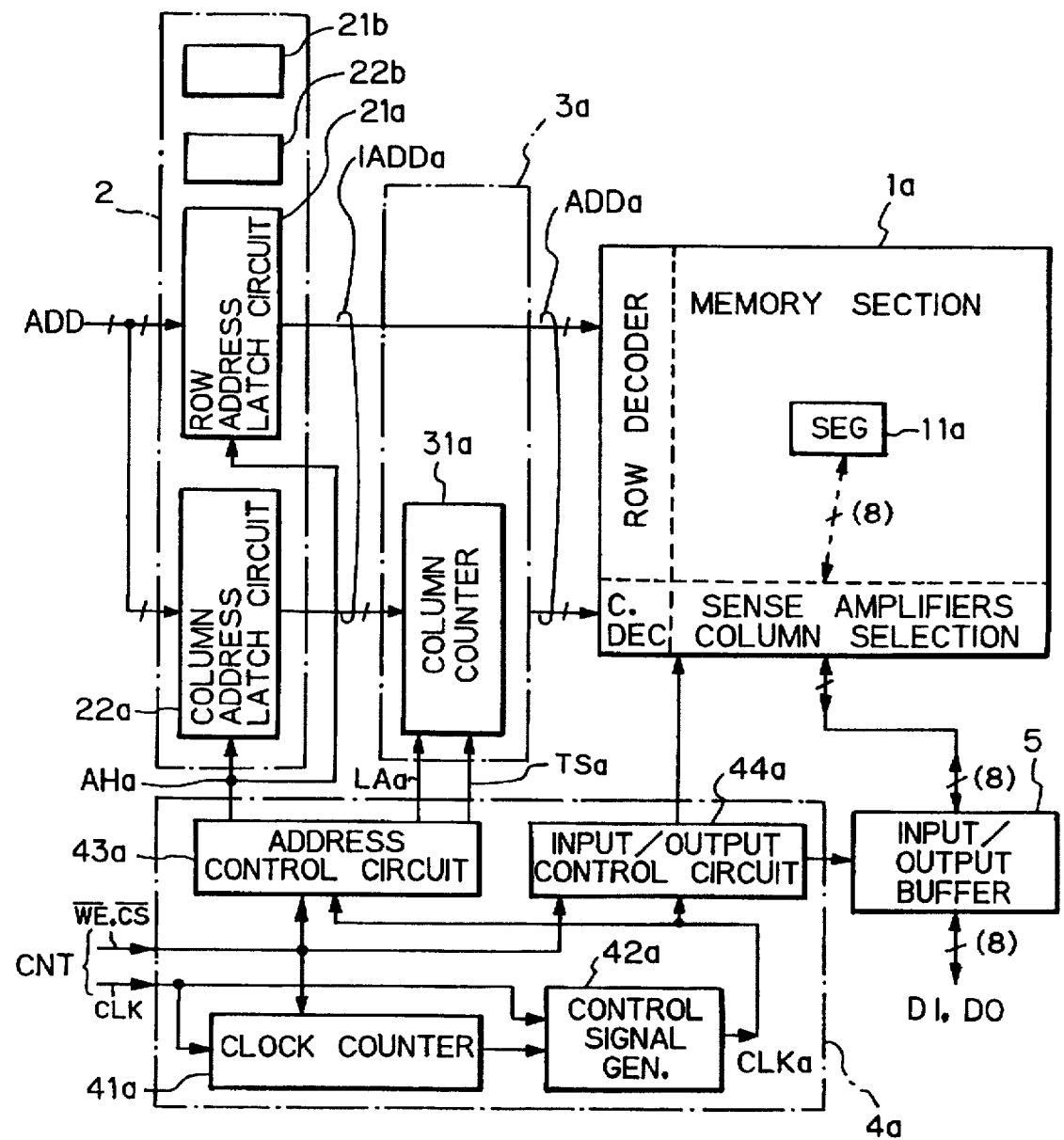
FIG. 5A is a detailed block circuit diagram of the memory section 1a and its peripherial circuits of FIG. 4.

In FIG. 5A, which is a detailed circuit diagram of the memory section 1a and its peripheral circuits of FIG. 4, the address buffer 2 includes a row address latch circuit 21a and a column address latch circuit 22a for the memory section 1a. The external address signal ADD is latched and held in the row address latch circuit 21a and the column address latch circuit 22a by an address hold signal AHa of the memory control circuit 4a.

The address counter 3a includes only a column counter 31a. Therefore, the output of the row address latch circuit 21a is transmitted directly to the row decoder of the memory section 1a. On the other hand, the output of the column address latch circuit 22a is incremented by the column counter 31a and is transmitted to the column decoder of the memory section 1a, thus operating the sense amplifiers and the column selection circuits of the memory section 1a.

The memory control circuit 4a includes a clock counter 41a, a control signal generating circuit 42a, an address control circuit 43a for generating the address hold signal AHa, the latch signal LAa and the timing signal TSQ, and a input/output control circuit 44a. The control signal generating circuit 42a generates a clock signal CLKa showing a time period corresponding to the latency of the memory section 1a and transmits it to the address control circuit 43a and the input/output control circuit 44a. That is, the control signal generating circuit 42a passes the clock signal CLK therethrough in accordance with the value of the clock counter 41a. Note that the clock counter 41a is cleared by a falling edge of the inverted signal of the chip selection signal CS. Also, the latch signal LAa is generated by the address control circuit 43a at a sloghtly delayed timing of the rising edge of the address hold signal AHa. Further, the timing signal TSa is generated by the address control circuit 43a in accordance with the clock signal CLKa.

That is, in the memory section 1a, one segment 11a is selected by the address signal ADDa, so that 8 memory cells of this selected segment are all in a selected state. In a write mode, input data DI are written from the input/output circuit 5 via the sense amplifiers and the column selection circuits into the memory cells. On the other hand, in a read mode, data from the memory cells are sensed by the sense amplifiers and are transmitted via the column selection circuits to the input/output buffer 5.

Figure 5B:
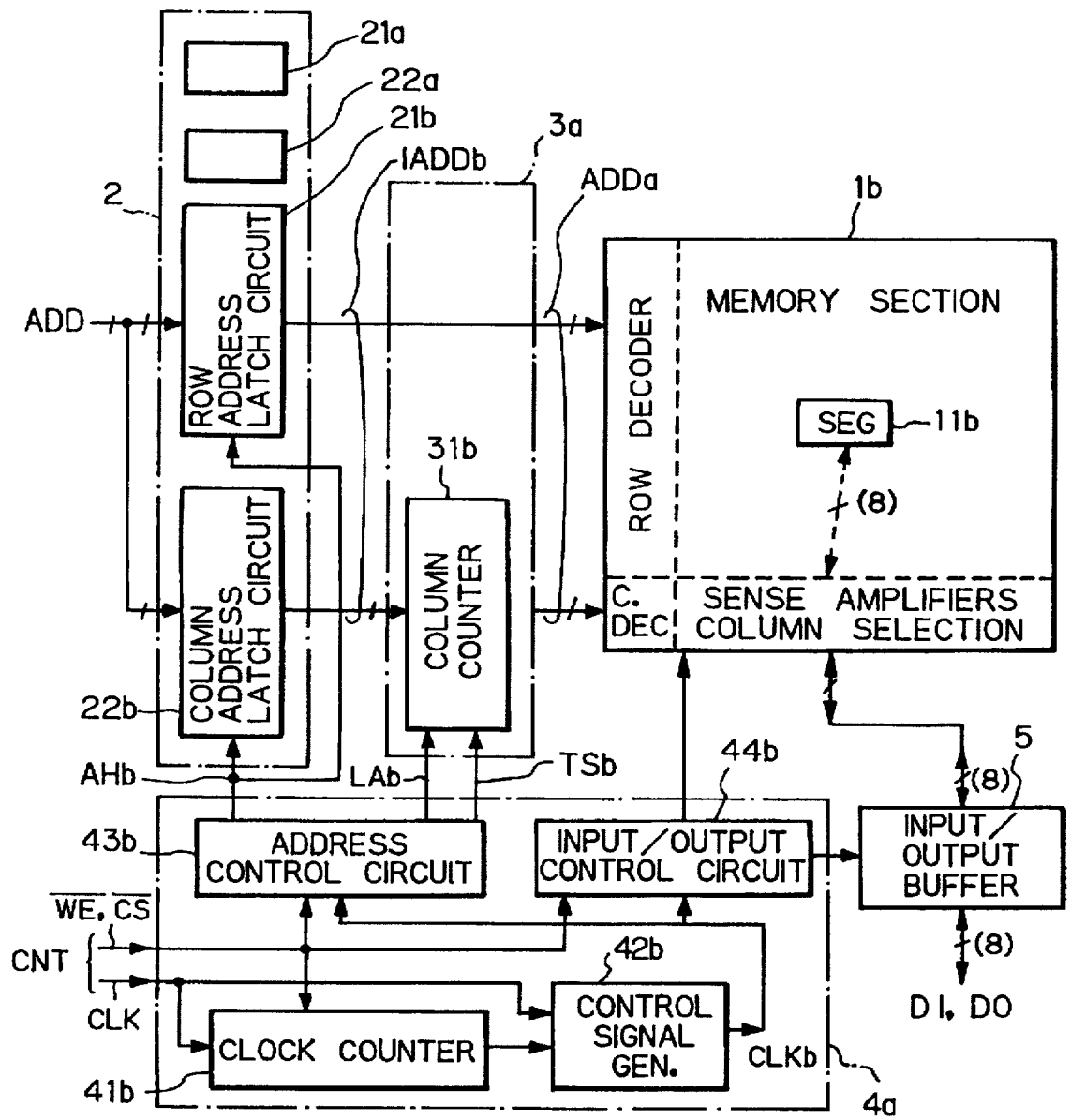
FIG. 5B is a detailed block circuit diagram of the memory section 1b and its peripherial circuits of FIG. 4.

In FIG. 5B, which is a detailed circuit diagram of the memory section 1b and its peripheral circuits of FIG. 4, the address buffer 2 includes a row address latch circuit 21b and a column address latch circuit 22b for the memory section 1b. The external address signal ADD is latched and held in the row address latch circuit 21b and the column address latch circuit 22b by an address hold signal AHb of the memory control circuit 4b.

The address counter 3b includes only a column counter 31b. Therefore, the output of the row address latch circuit 21b is transmitted directly to the row decoder of the memory section 1b. On the other hand, the output of the column address latch circuit 22b is incremented by the column counter 31b and is transmitted to the column decoder of the memory section 1b, thus operating the sense amplifiers and the column selection circuits of the memory section 1b.

The memory control circuit 4b includes a clock counter 41b, a control signal generating circuit 42b, an address control circuit 43b for generating the address hold signal AHb, the latch signal LAb and the timing signal TSQ, and an input/output control circuit 44b. The control signal generating circuit 42b generates a clock signal CLKb showing a time period corresponding to the latency of the memory section 1a and transmits it to the address control circuit 43b and the input/output control circuit 44b. That is, the control signal generating circuit 42b passes the clock signal CLK therethrough in accordance with the value of the clock counter 41b. Note that the clock counter 41b is cleared by the falling edge of the inverted signal of the chip selection signal CS. Also, the latch signal LAb is generated by the address control circuit 43b at a little delayed timing of the rising edge of the address hold signal AHb. Further, the timing signal TSb is generated by the address control circuit 43a in accordance with the clock signal CLKb.

That is, also in the memory section 1b, one segment 11b is selected by the address signal ADDa, so that 8 memory cells of this selected segment are all in a selected state. In a write mode, input data DI are written from the input/output circuit 5 via the sense amplifiers and the column selection circuits into the memory cells. On the other hand, in a read mode, data from the memory cells are sensed by the sense amplifiers and are transmitted via the column selection circuits to the input/output buffer 5.

The operation of the devices of FIGS. 4, 5A and 5B is explained next with reference to FIGS. 6A through 6K.

The clock signal CLK is changed as shown in FIG. 6A.

First, at time t1, the inverted signal of the chip selection signal CS is changed from high to low as shown in FIG. 6B. As a result, the address hold signal AHa is generated as shown in FIG. 6C, and a short time later, the latch signal LAd is generated as shown in FIG. 6D. Therefore, a first part of the external address signal ADD as shown in FIG. 6I is latched as an address A0 as shown in FIG. 6J in the address counter 3a as well as the address buffer 2. Note that a time period τa corresponds to the latency of the memory section 1a. As a result, a segment 11a designated by the address A0 is selected. For example, in a read mode, read data of the selected segment are being sensed by the sense amplifiers and are being transmitted via the column selection circuits to the input/output buffer 5.

Simultaneously, the address hold signal AHb is generated as shown in FIG. 6F, and a short time later, the latch signal LAb is generated as shown in FIG. 6G. Therefore, a second part of the external address signal ADD as shown in FIG. 6I is latched as an address B0 as shown in FIG. 6K in the address counter 3b as well as the address buffer 2. Note that a time period τb corresponds to the latency of the memory section 1b. As a result, a segment 11b designated by the address B0 is selected. For example, in a read mode, read data of the selected segment are being sensed by the sense amplifiers and are being transmitted via the column selection circuits to the input/output buffer 5.

At time t2, when the latency τa of the memory section 1a has passed, the timing signal TSa is generated as shown in FIG. 6E. As a result, the address ADDa of the address counter 3a is incremented as shown in FIG. 6J in synchronization with the timing signal TSa. That is, the address ADDa of the address counter 3a is sequentially changed as follows:

A1=A0+1
A2=A0+2
.
.
.
A7=A0+7

Note that the control signal circuit 42a of FIG. 5A is designed to generate the clock signal CLKa having a definite number of pulses which is, in this case, 7. Therefore, the address ADDa of the address counter 3a is maintained at A7. As a result, segments designated by the addresses A1, A2, . . . , A7 are sequentially selected. For example, in a read mode, read data of the selected segments are sensed by the sense amplifiers and are transmitted via the column selection circuits to the input/output buffer 5.

Thus, as shown in FIG. 6L, the input/output buffer 5 generates data of the memory section 1a corresponding to the addresses A0, A1, . . . , A7.

At time t3, when the latency τb of the memory section 1b has passed, the timing signal TSb is generated as shown in FIG. 6H. As a result, the address ADDb of the address counter 3b is incremented as shown in FIG. 6K in synchronization with the timing signal TSb. That is, the address ADDa of the address counter 3b is sequentially changed as follows:

B1=B0+1
B2=B0+2
.
.
.
B7=B0+n

Note that the control signal circuit 42b of FIG. 5B is designed to generate the clock signal CLKb having a definite number of pulses which is, in this case, n. Therefore, the address ADDb of the address counter 3b is maintained at Bn. As a result, segments designated by the addresses B1, B2, . . . , Bn are sequentially selected. For example, in a read mode, read data of the selected segments are sensed by the sense amplifiers and are transmitted via the column selection circuits to the input/output buffer 5.

Thus, as shown in FIG. 6L, the input/output buffer 5 generates data of the memory section 1b corresponding to the addresses B0, B1, . . . , Bn.

In FIGS. 5A and 5B, if the row address latch circuit 21a also serves as the row address latch circuit 21b, when the inverted signal of the chip selection signal CS is changed from high to low, as illustrated in FIG. 7, the segments 11a of the memory section 1a designated by the addresses A0, A1, . . . , A7 are selected, and subsequently, the segments 11b of the memory section 1b designated by the addresses B0, B1, . . . , Bn are selected. In this case, all the segments designated by the addresses A0, A1, . . . , A7 and B0, B1, . . . , Bn belong to the same row.

In the first embodiments, since data of the segments of the high speed memory section 1a are input or output before the inputting/outputting of data of the segments of the low speed memory section 1b, the ratio of the latency to a time required for a serial access can be substantially reduced, which increases the data rate per one byte. For example, if the latency of the memory section 1a is 20 ns, the latency of the memory section 1b is 100 ns, and a time required for inputting or outputting one segment is one cycle (10 ns), a time required for a serial access length 1024 (=8192 bits) is $$(20+10\times8+10\times(1024-8))/1024=10.02 \text{ ns} \qquad (2)$$

Thus, the data rate can be remarkably increased as compared with the prior art as defined by the formula (1).

Also, in the first embodiment, since data of each segment is input/output without transformation of bit width, the data buffer 103 of FIG. 1 is unnecessary, which can simplify the circuit configuration.

Further, in the first embodiment, even if the memory section 1a is comprised of an expensive SRAM configuration and the memory section 1b is comprised of an inxpensive DRAM configuration, the smaller the ratio of the SRAM configuration to the DRAM configuration, the larger the serial access length. Therefore, the manufacturing cost can be reduced.

In FIG. 4, the memory section 1a can have an SRAM configuration, and the memory section 1b can have a DRAM configuration.

Figure 8:
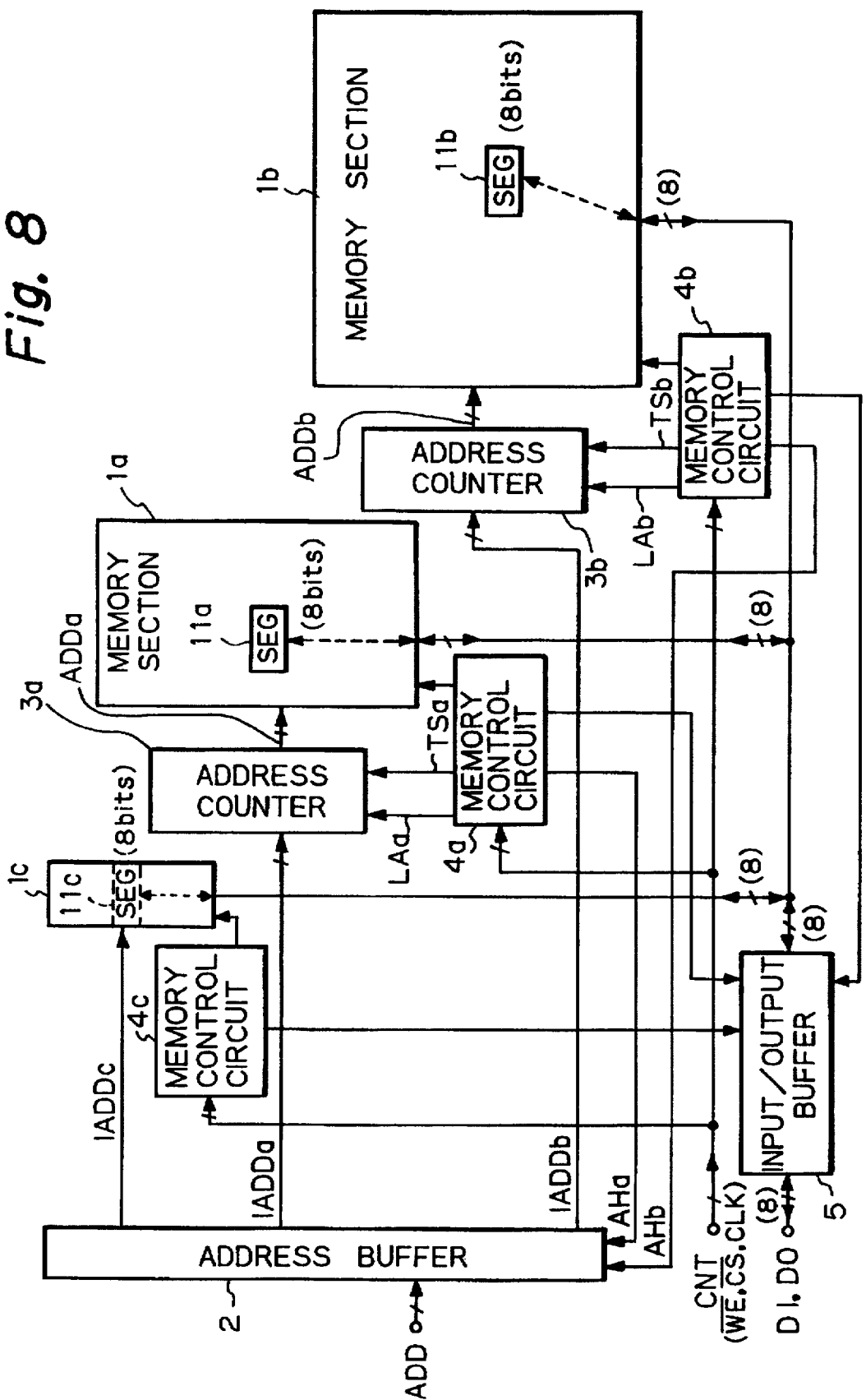
FIG. 8 is a circuit diagram illustrating a second embodiment of the serial access memory device according to the present invention.

In FIG. 8, which illustrates a second embodiment of the present invention, a memory section 1c having a smaller latency τc than that of the memory section 1a and a memory control circuit 4c for controlling the memory section 1c are added to the elements of FIG. 4. In this case, the address buffer 2 generates an internal address signal IADDc and transmits it to the memory section 1c; however, in order to similify the configuration of the address buffer 2, the row address latch circuit 21a of FIG. 5A can generate the internal address signal IADDc.

Figure 9:
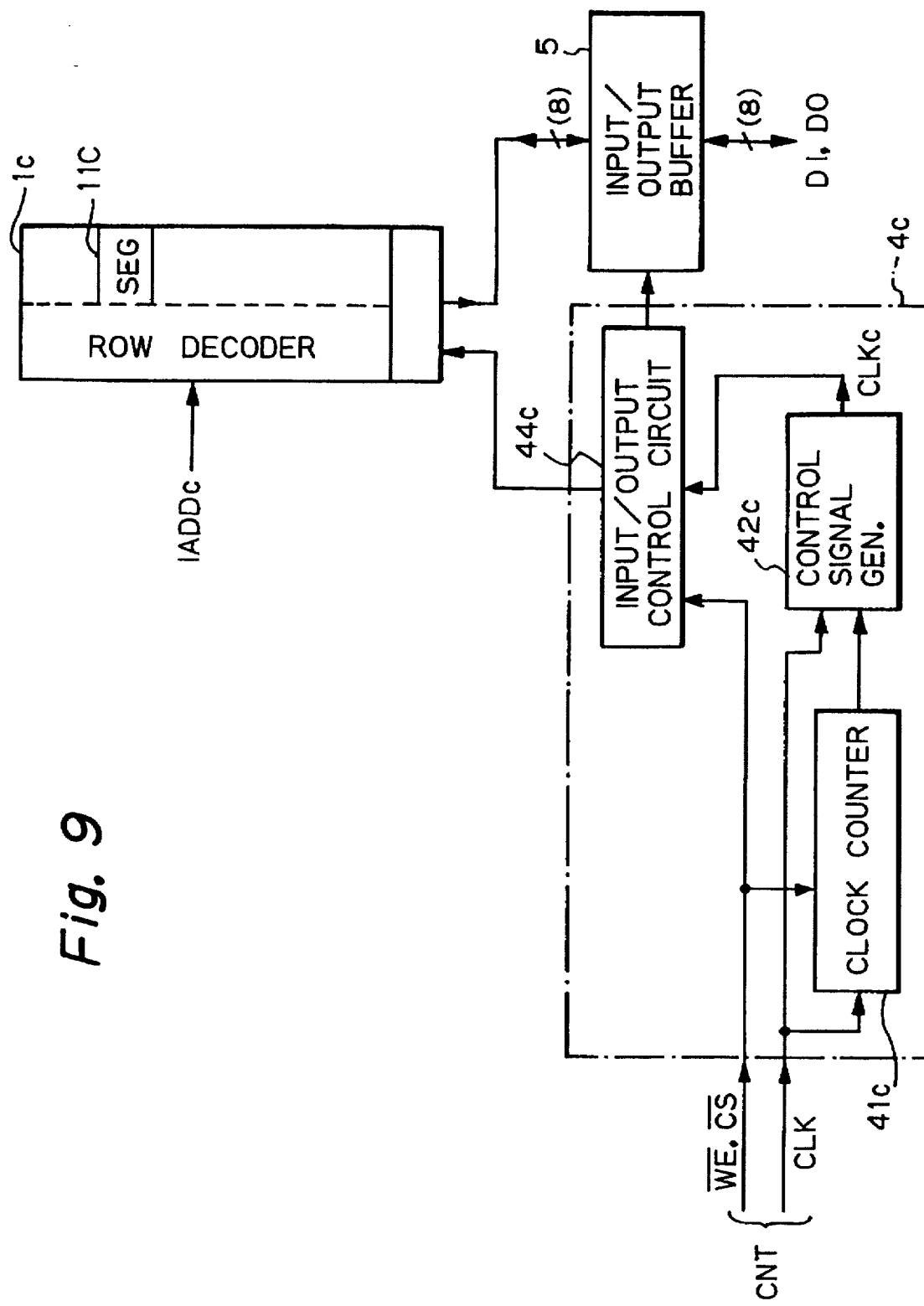
FIG. 9 is a detailed block circuit diagram of the memory section 1c and its peripherial circuits of FIG. 8.

In FIG. 9, which is a detailed circuit diagram of the memory section 1c and its peripherial circuits of FIG. 8, the memory control circuit 4c includes a clock counter 41c, a control signal generating circuit 42c, and an input/output control circuit 44c. The control signal generating circuit 42c generates a clock signal CLKc showing a time period corresponding to the latency of the memory section 1c and transmits it to the input/output control circuit 44c. That is, the control signal generating circuit 42c passes the clock signal CLK therethrough in accordance with the value of the clock counter 41c. Note that the clock counter 41a is cleared by a falling edge of the inverted signal of the chip selection signal CS.

The operation of the devices of FIGS. 8 and 9 is explained next with reference to FIGS. 10A through 10M.

The clock signal CLK is changed as shown in FIG. 10A.

First, at time t1, the inverted signal of the chip selection signal CS is changed from high to low as shown in FIG. 10B. As a result, the address hold signal AHa is generated as shown in FIG. 10C, and a short time later, the latch signal LAa is generated as shown in FIG. 6D. Therefore, a first part of the external address signal ADD as shown in FIG. 10I is latched as an address A0 as shown in FIG. 10K in the address counter 3a as well as the address buffer 2. Also, the row component C of the address is transmitted as the address signal ADDc to the memory section 1c. Note that a time period τc corresponds to the latency of the memory section 1c. As a result, a segment 11c designated by the address C and a segment 11a designated by the address A0 are selected. For example, in a read mode, read data of the selected segments are being sensed by the sense amplifiers and are being transmitted via the column selection circuits to the input/output buffer 5.

Simultaneously, the address hold signal AHb is generated as shown in FIG. 10F, and a short time later, the latch signal LAb is generated as shown in FIG. 10G. Therefore, a second part of the external address signal ADD as shown in FIG. 10I is latched as an address B0 as shown in FIG. 10L in the address counter 3b as well as the address buffer 2. As a result, a segment 11b designated by the address B0 is selected. For example, in a read mode, read data of the selected segment are being sensed by the sense amplifiers and are being transmitted via the column selection circuits to the input/output buffer 5.

At time t2, when the latency τc of the memory section 1c has passed, the input/output buffer 5 generates data of the memory section 1c corresponding to the address C as shown in FIG. 10M.

At time t3, when the latency τa of the memory section 1a has passed, the timing signal TSa is generated as shown in FIG. 10E. As a result, the address ADDa of the address counter 3a is incremented as shown in FIG. 10K in synchronization with the timing signal TSa. That is, the address ADDa of the address counter 3a is sequentially changed as follows:

A1=A0+1

A2=A0+2

.
.
.

A7=A0+7

Therefore, the address ADDa of the address counter 3a is maintained at A7. As a result, segments designated by the addresses A1, A2, . . . , A7 are sequentially selected. For example, in a read mode, read data of the selected segments are sensed by the sense amplifiers and are transmitted via the column selection circuits to the input/output buffer 5.

Thus, as shown in FIG. 10M, the input/output buffer 5 generates data of the memory section 1a corresponding to the addresses A0, A1, . . . , A7.

At time t4, when the latency τb of the memory section 1b has passed, the timing signal TSb is generated as shown in FIG. 10H. As a result, the address ADDb of the address counter 3b is incremented as shown in FIG. 10L in synchronization with the timing signal TSb. That is, the address ADDa of the address counter 3b is sequentially changed as follows:

B1=B0+1

B2=B0+2

.
.
.

B7=B0+n

Therefore, the address ADDb of the address counter 3b is maintained at Bn. As a result, segments designated by the addresses B1, B2, . . . , Bn are sequentially selected. For example, in a read mode, read data of the selected segments are sensed by the sense amplifiers and are transmitted via the column selection circuits to the input/output buffer 5.

Thus, as shown in FIG. 10M, the input/output buffer 5 generates data of the memory section 1b corresponding to the addresses B0, B1, . . . , Bn.

In FIGS. 8 and 9, if the row addresses of the addresses ADDa and ADDb are the same as the address C, when the inverted signal of the chip selection signal CS is changed from high to low, the segment 11c of the memory section 1c designated by the address C, as illustrated in FIG. 11, the segments 11a of the memory section 1a designated by the addresses A0, A1, . . . , A7 are selected, and subsequently, the segments 11b of the memory section 1b designated by the addresses B0, B1, . . . , Bn are selected. In this case, all the segments designated by the addresses C, A0, A1, . . . , A7 and B0, B1, . . . , Bn belong to the same row.

In the second embodiment, since data of the segment of the higher speed memory section 1c are input or output before the inputting/outputting of data of the segments of the high speed memory section 1a, the ratio of the latency to a time required for a serial access can be substantially further reduced as compared with the first embodiment, which further increases the data rate per one byte. For example, if the latency of the memory section 1c is 10 ns the latency of the memory section 1a is 20 ns, the latency of the memory section 1b is 100 ns, and a time required for inputting or outputting one segment is one cycle (10 ns), a time required for a serial access length 1024 (=8192 bits) is $$(10+10\times 8+10\times (1024-8))/1024=10.01 \text{ ns} \qquad (3)$$

Thus, the data rate can also be remarkably increased as compared with the prior art as defined by the formula (1).

As explained hereinbefore, according to the present invention, the data rate of a serial access memory device can be remarkably increased, and the circuit configuration can be simplified. Also, the manufacturing cost can be reduced.

I claim:

1. A serial access memory device comprising:

a first memory section divided into a plurality of first segments and having a first latency;

a second memory section divided into a plurality of second segments and having a second latency longer than said first latency;

first addressing means, connected to said first memory section, for sequentially generating first addresses to access the first segments of said first memory section;

second addressing means, connected to said second memory section, for sequentially generating second addresses to access the second segments of said second memory section; and control means, connected to said first and second addressing means, for simultaneously initiating operations of said first and second addressing means and completing the operation of said first addressing means within a time period corresponding to said second latency.

2. The device as set forth in claim 1, further comprising:

a third memory section divided into a plurality of third segments and having a third latency shorter than said first latency; and third addressing means, connected to said third memory section, for sequentially generating third addresses to access the third segments of said third memory section, said control means, further connected to said third addressing means, for initiating an operation of said third addressing means simultaneously with the opera tions of said first and second addressing means and completing the operation of said third addressing means within a time period corresponding to said first latency.

3. The device as set forth in claim 1, further comprising an input/output buffer connected to said first and second memory sections.

4. The device as set forth in claim 2, further comprising an input/output buffer connected to said first, second and third memory sections.

5. The device as set forth in claim 1, wherein row components of said first addresses are the same as row components of said second addresses.

6. The device as set forth in claim 2, wherein row components of said first addresses and row components of said second addresses are the same as said third addresses.

7. The device as set forth in claim 1, wherein said first memory section has an SRAM configuration, and said second memory section has a DRAM configuration.

* * * * *